United States Patent
Fiukowski et al.

(10) Patent No.: US 10,982,320 B2
(45) Date of Patent: Apr. 20, 2021

(54) DEVICE AND METHOD FOR PRODUCING DEFINED PROPERTIES OF GRADIENT LAYERS IN A SYSTEM OF MULTILAYERED COATINGS IN SPUTTERING INSTALLATIONS

(71) Applicant: GRENZEBACH MASCHINENBAU GMBH, Asbach-Baeumenheim (DE)

(72) Inventors: Joerg Fiukowski, Thorgau (DE); Gerd Kleideiter, Ahaus (DE)

(73) Assignee: GRENZEBACH MASCHINENBAU GMBH, Asbach-Baeumenheim (DE)

( * ) Notice: Subject to any disclaimer, the term of this patent is extended or adjusted under 35 U.S.C. 154(b) by 0 days.

(21) Appl. No.: 16/091,578

(22) PCT Filed: Oct. 18, 2017

(86) PCT No.: PCT/DE2017/000348
§ 371 (c)(1),
(2) Date: Oct. 5, 2018

(87) PCT Pub. No.: WO2018/072774
PCT Pub. Date: Apr. 26, 2018

(65) Prior Publication Data
US 2019/0233936 A1  Aug. 1, 2019

(30) Foreign Application Priority Data
Oct. 19, 2016 (DE) ..................... 10 2016 012 460.1

(51) Int. Cl.
*H01J 37/32* (2006.01)
*C23C 14/34* (2006.01)
(Continued)

(52) U.S. Cl.
CPC .......... *C23C 14/3485* (2013.01); *C03C 17/36* (2013.01); *C03C 17/366* (2013.01);
(Continued)

(58) Field of Classification Search
CPC .......... H01J 37/32027; H01J 37/32146; C23C 14/3485
See application file for complete search history.

(56) References Cited

U.S. PATENT DOCUMENTS 7,785,721 B2  8/2010  List et al.
2007/0068794 A1*  3/2007  Lippey ................ C23C 14/0073
204/192.1
(Continued)

FOREIGN PATENT DOCUMENTS

DE  102012109691  2/2014
WO  2005093781  10/2005

*Primary Examiner* — Jason Berman
(74) *Attorney, Agent, or Firm* — Duane Morris, LLP; Gregory M. Lefkowitz

(57) ABSTRACT

Device and method for producing defined properties of gradient layers in a system of multilayered coatings in sputtering installations with the following features: a) a pair of cathodes arranged in a common process chamber and consisting of a first cathode body and a second cathode body is supplied with direct current by means of a common power supply, wherein, before entering the process chamber, the direct current is converted into a series of pulses comprising alternating positive and negative pulses with interpulse periods in between, b) an arrangement for controlling the length of the individual pulses and the duration of the respective interpulse periods.

14 Claims, 5 Drawing Sheets

Figure 1:
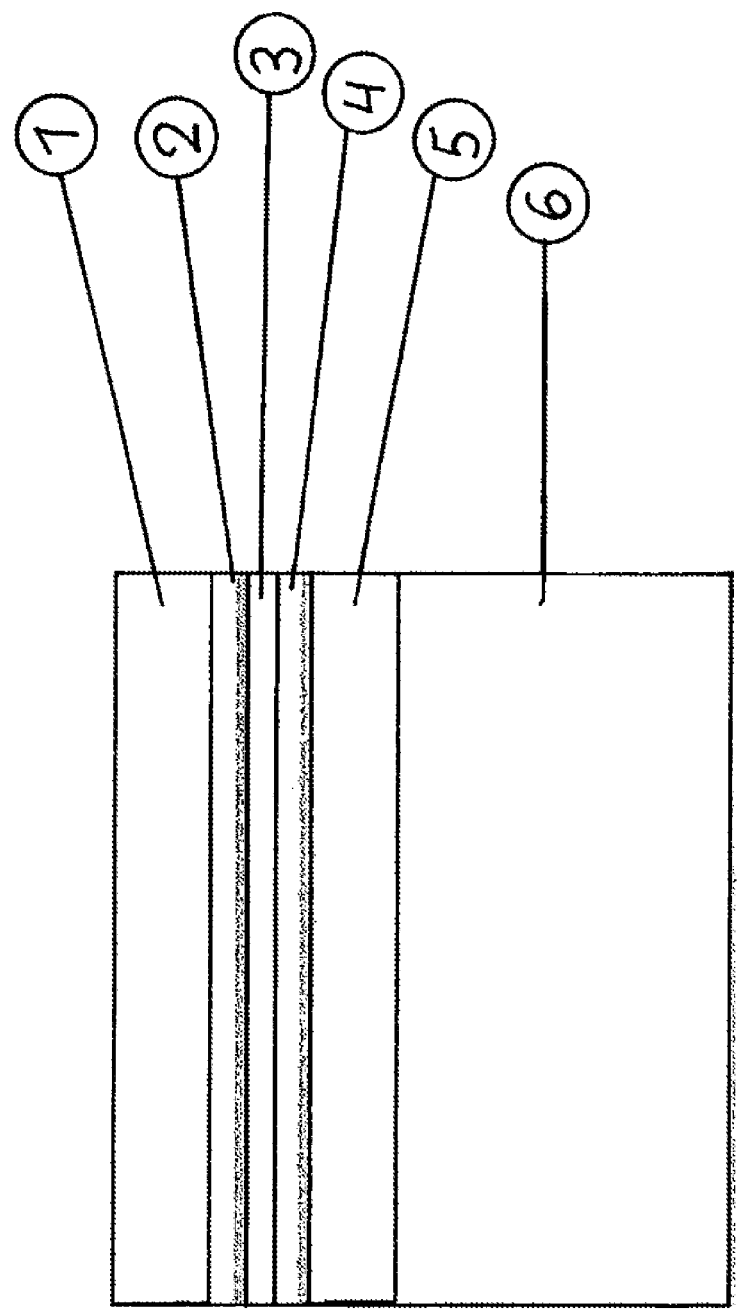

(51) Int. Cl.
*H01J 37/34* (2006.01)
*C23C 14/35* (2006.01)
*C03C 17/36* (2006.01)
*C23C 14/54* (2006.01)

(52) U.S. Cl.
CPC ...... *C03C 17/3626* (2013.01); *C03C 17/3644* (2013.01); *C03C 17/3694* (2013.01); *C23C 14/3464* (2013.01); *C23C 14/3492* (2013.01); *C23C 14/352* (2013.01); *C23C 14/54* (2013.01); *H01J 37/32027* (2013.01); *H01J 37/32146* (2013.01); *H01J 37/3405* (2013.01); *H01J 37/3408* (2013.01); *H01J 37/3417* (2013.01); *H01J 37/3467* (2013.01)

(56) References Cited

U.S. PATENT DOCUMENTS

| | | | |
|---|---|---|---|
| 2007/0095651 A1* | 5/2007 | Ye | H01J 37/3423 204/192.1 |
| 2007/0181417 A1* | 8/2007 | Chistyakov | C23C 14/352 204/192.1 |
| 2011/0038187 A1 | 2/2011 | Horishita et al. | |
| 2012/0164051 A1* | 6/2012 | Bruns | C23C 14/0078 423/325 |
| 2014/0231243 A1* | 8/2014 | Finley | H05H 1/46 204/192.12 |
| 2014/0272354 A1* | 9/2014 | Ding | C03C 17/3639 428/216 |
| 2014/0311892 A1 | 10/2014 | Krassnitzer | |
| 2015/0021167 A1 | 1/2015 | Christie | |

* cited by examiner

DEVICE AND METHOD FOR PRODUCING DEFINED PROPERTIES OF GRADIENT LAYERS IN A SYSTEM OF MULTILAYERED COATINGS IN SPUTTERING INSTALLATIONS

CROSS-REFERENCE TO RELATED APPLICATIONS

This application is a § 371 national stage entry of International Application No. PCT/DE2017/000348, filed on Oct. 18, 2017, which claims priority to German Patent Application No. 10 2016 012 460.1, filed Oct. 19, 2016, the entire contents of which are incorporated herein by reference.

The invention relates to a device and a method for producing defined properties of gradient layers in a system of multilayered coatings in sputtering installations.

Magnetic-field-assisted cathode sputtering (magnetron sputtering) has penetrated into many fields of modern surface technology. Proceeding from applications in microelectronics, magnetron sputtering is presently established as an industrial coating method for architectural glass, flatscreen displays, spectacle lenses, tape materials, tools, decorative objects, and functional components. In this case, functional components are often provided with corrosion protection or hard material layers made of nitrides such as TiN, TaN, VN, ZrN or carbonitrides such as TiCN in single-layer or multilayered technology. Superhard layers based on nano-multilayered layers having hardness values up to 50 GPa are increasingly also applied. Friction-reducing and wear-reducing metal-carbon layers have proven themselves extremely beneficial in the automotive industry.

The largest vacuum coating installations, and therefore often also the installations having the highest power consumption, are the typical horizontal in-line installations for architectural glass coating.

A heat-treatable sun protection and heat protection layer system and a method for the production thereof are known in the prior art from DE 103 56 357 B4. This document is based on the object of describing a sun protection system applicable to glass by means of vacuum coating and a method for the production thereof, which is variably heat-treatable and does not have a visible color shift in this case, while maintaining the chemical and mechanical resistance.

Claim 1 relates in this case to a heat-treatable sun protection and heat protection system applicable to glass by means of vacuum coating, which has at least one metal layer arrangement and in each case an adjoining lower dielectric layer arrangement positioned below it and an upper dielectric layer arrangement positioned above it. This system is characterized in that both at least one metal layer arrangement (4) and also at least one upper dielectric layer arrangement (2) and at least one lower dielectric layer arrangement (3) are embodied as a multilayer arrangement, in which a metal layer (8) consisting of at least one single layer is embedded within the metal layer arrangement (4) by an upper intermediate layer (9) and a lower intermediate layer (7) made of the substoichiometric nitrided or oxidized metal of the metal layer (8), and in which both the lower dielectric layer arrangement (3) and also the upper dielectric layer arrangement (2) have a stoichiometric layer (5, 11) of a metal oxide or semiconductor oxide or metal nitride or semiconductor nitride or of a nitride, oxide, or oxinitride of silicon, wherein the layers are positioned within the dielectric layer arrangement (2, 3) such that in comparison to the adjacent layer, the layer having the higher oxygen or nitrogen deficiency of the metal oxide or semiconductor oxide, of the metal nitride or semiconductor nitride, or of the nitride, oxide, or oxinitride of silicon always lies on the side facing toward the metal layer (8).

A reactive sputtering process is known from WO 2013/083238 A1. According to the specifications in claim 1, it relates to a method for reactive sputtering in which material is driven out of the surface of a first target by means of ion bombardment and enters the gas phase, wherein negative voltage is applied in pulses to the target such that an electrical current having a current density greater than 0.5 A/cm$^2$ occurs on the target surface, and therefore the material entering the gas phase is at least partially ionized, and wherein a reactive gas flow is built up and reactive gas reacts with the material of the target surface, characterized in that the duration of a voltage pulse is selected such that during the voltage pulse, the target surface is at least partially covered with a compound made of reactive gas and target material at the point or points at which the current flows for the longest time, and this coverage is less at the end of the voltage pulse than at the beginning of the voltage pulse, and therefore the target surface is in a second intermediate state at the end of the voltage pulse.

In this known method, the power density is very high, which relatively strongly elevates the demands for the cooling. Moreover, the variability of the gradient of a possible protective layer is very restricted.

The present invention is based on the object of specifying a device and a method, using which building up multilayered coating systems in sputtering installations is possible in an easy and energy-saving manner, wherein the variability of the gradient of a protective layer is to be achieved in a simple manner.

This object is achieved by the device as claimed in claim 1, a device for producing defined properties of gradient layers in a system of multilayered coatings in sputtering installations comprising the following features:

a) a cathode pair arranged in a common processing chamber, consisting of a first cathode body and a second cathode body, is supplied with direct current by means of a common power supply, wherein the direct current is converted before the entry into the processing chamber into a pulse sequence having alternating positive and negative pulses with interposed pulse pauses, b) an arrangement for controlling the length of the individual pulses and the duration of the respective pulse pauses, c) an arrangement for adjusting the two cathodes in such a manner that a common deposition region results on the substrate to be coated, d) a common process gas system, which supplies the basic supply of the process gas, wherein a separate symmetrically arranged segmented process gas system is associated with each cathode body.

Moreover, it is claimed that the first cathode body is equipped with a different target material than the second cathode body.

It is also claimed that if cathode bodies in the form of tubes are used, the orientation of the magnetic fields of the individual tubular cathodes can be controlled.

And it is claimed that at least one or multiple turbomolecular pumps are arranged in each case above the cathode pair.

And it is claimed that the cathode arrangements consist of planar cathodes and tubular cathodes. Or said object is achieved by the method as claimed in claim 6, respectively.

A method for producing defined properties of gradient layers in a system of multilayer coatings in sputtering installations having the following method features:

a) in the installation for the respective coating method, the direct-current or mean frequency generator (10) is replaced by a bipolar pulse generator (21), wherein up to 30% process energy is saved, b) the output which supplies the positive pulse is connected to one of the two cathodes corresponding to the respective coating task, c) the output which supplies the negative pulse is connected to the other of the two cathodes corresponding to the respective coating task, d) the control of the duration of the respective pulses is carried out in accordance with the relevant coating task.

Moreover, it is claimed that the breaks between the individual pulses interrupt the sputtering process. And a computer program having program code for carrying out the method steps when the program is executed in a computer. And a machine-readable carrier having the program code of a computer program for carrying out the method as claimed in any one of claim 6 or 7 when the program is executed in a computer.

The device according to the invention will be described in greater detail hereafter.

In the specific figures:

FIG. 1: shows the schematic structure of a layer stack

Figure 2:
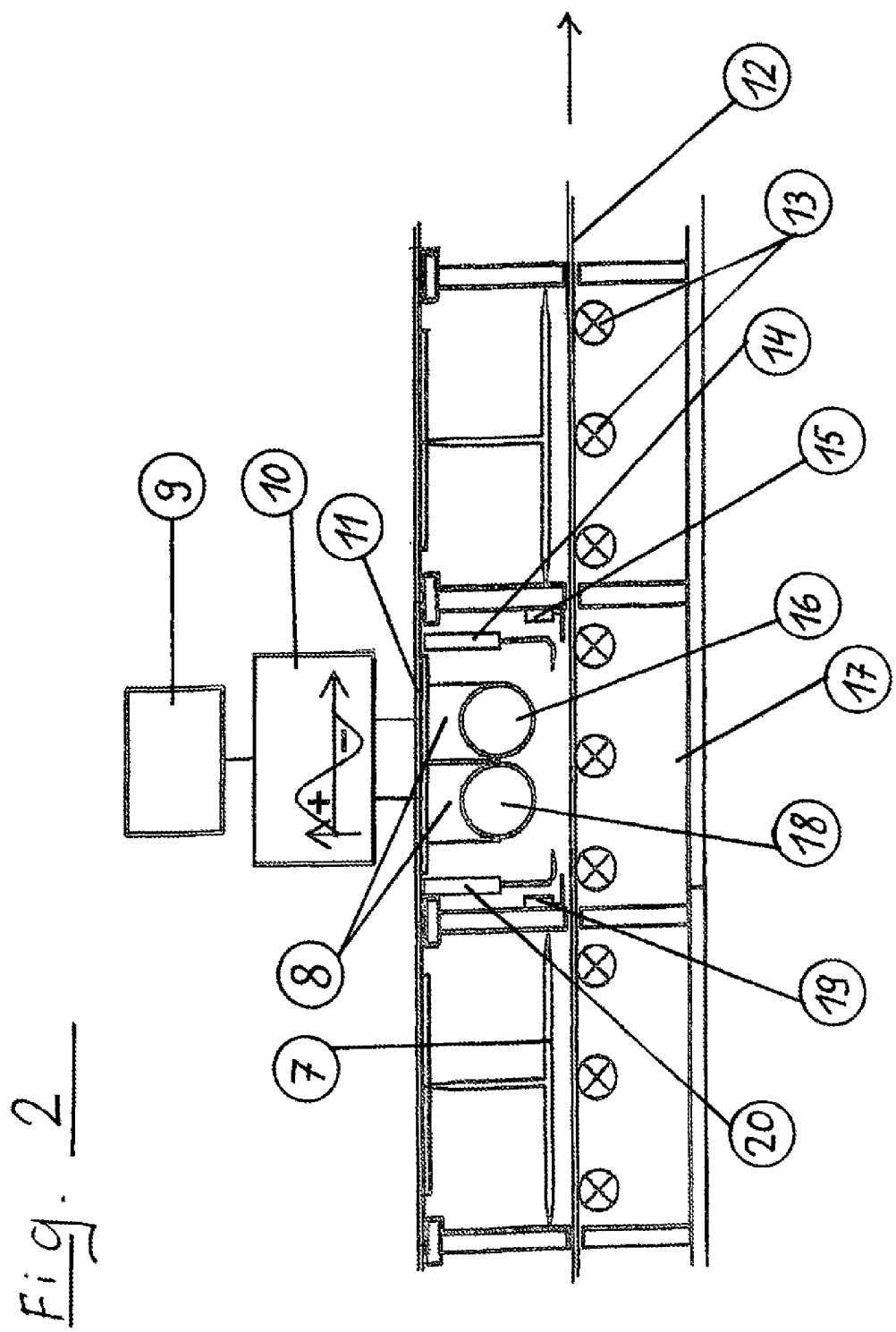

FIG. 2: shows an illustration of a conventional coating station

Figure 3:
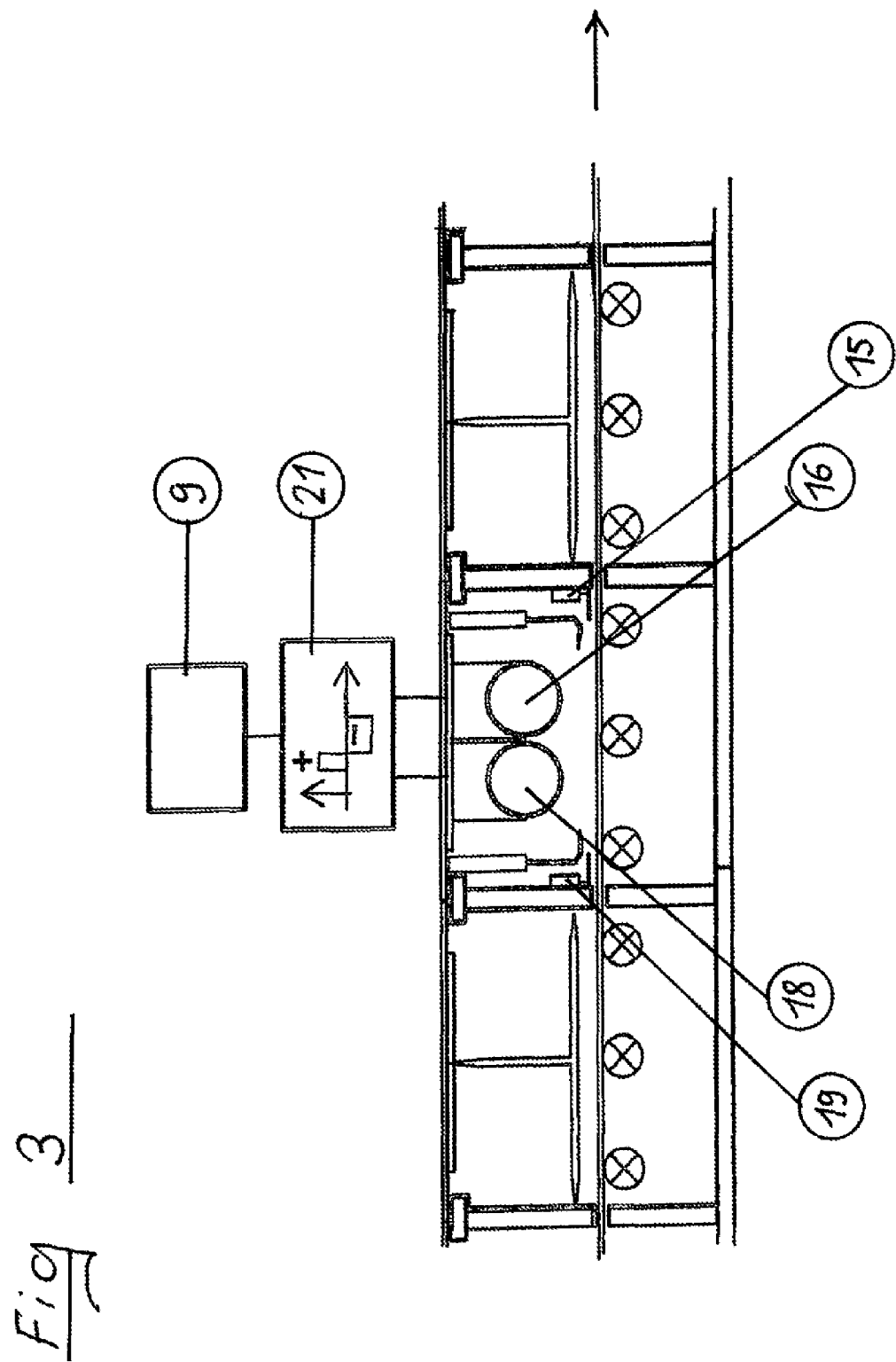
Figure 4:
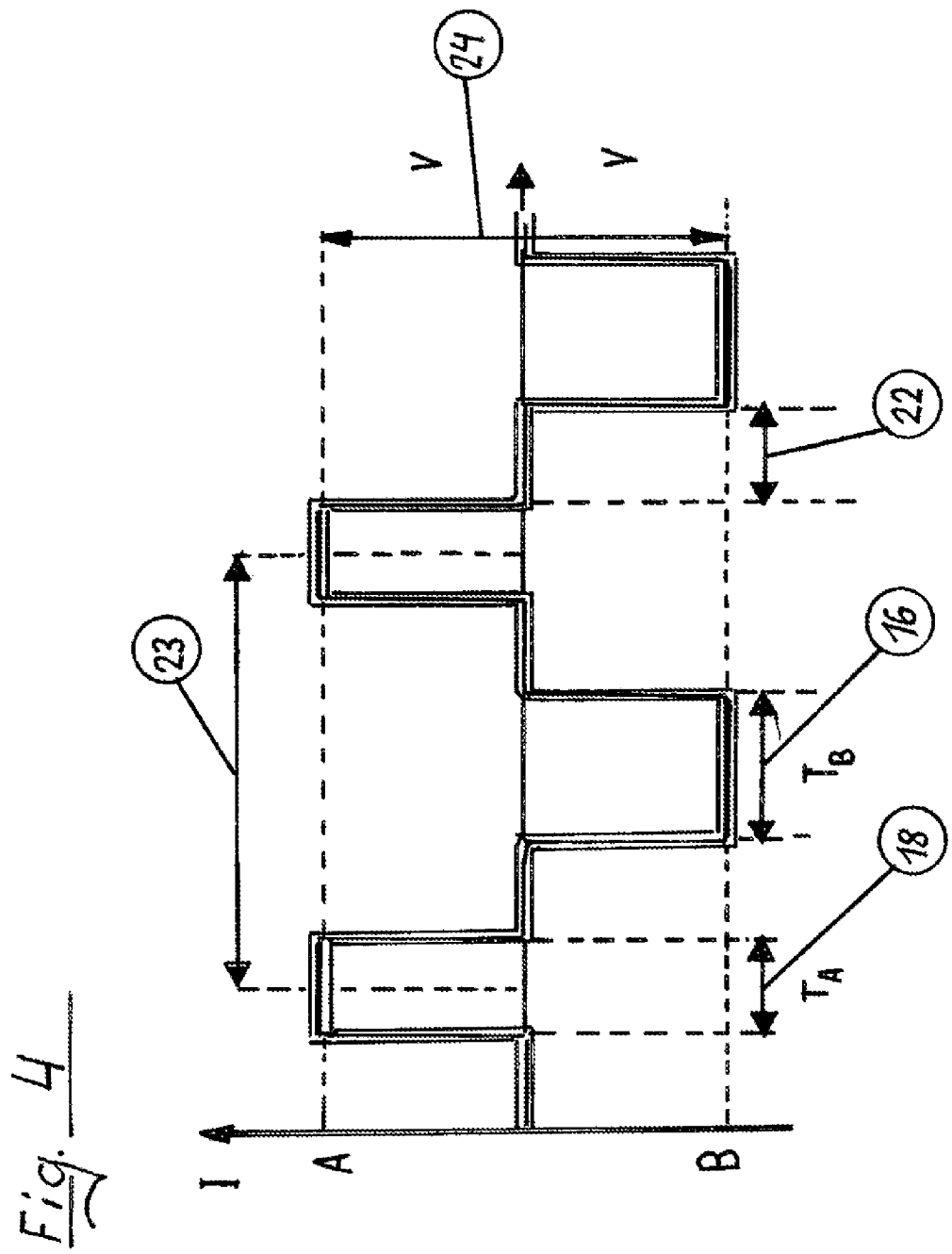
Figure 5:
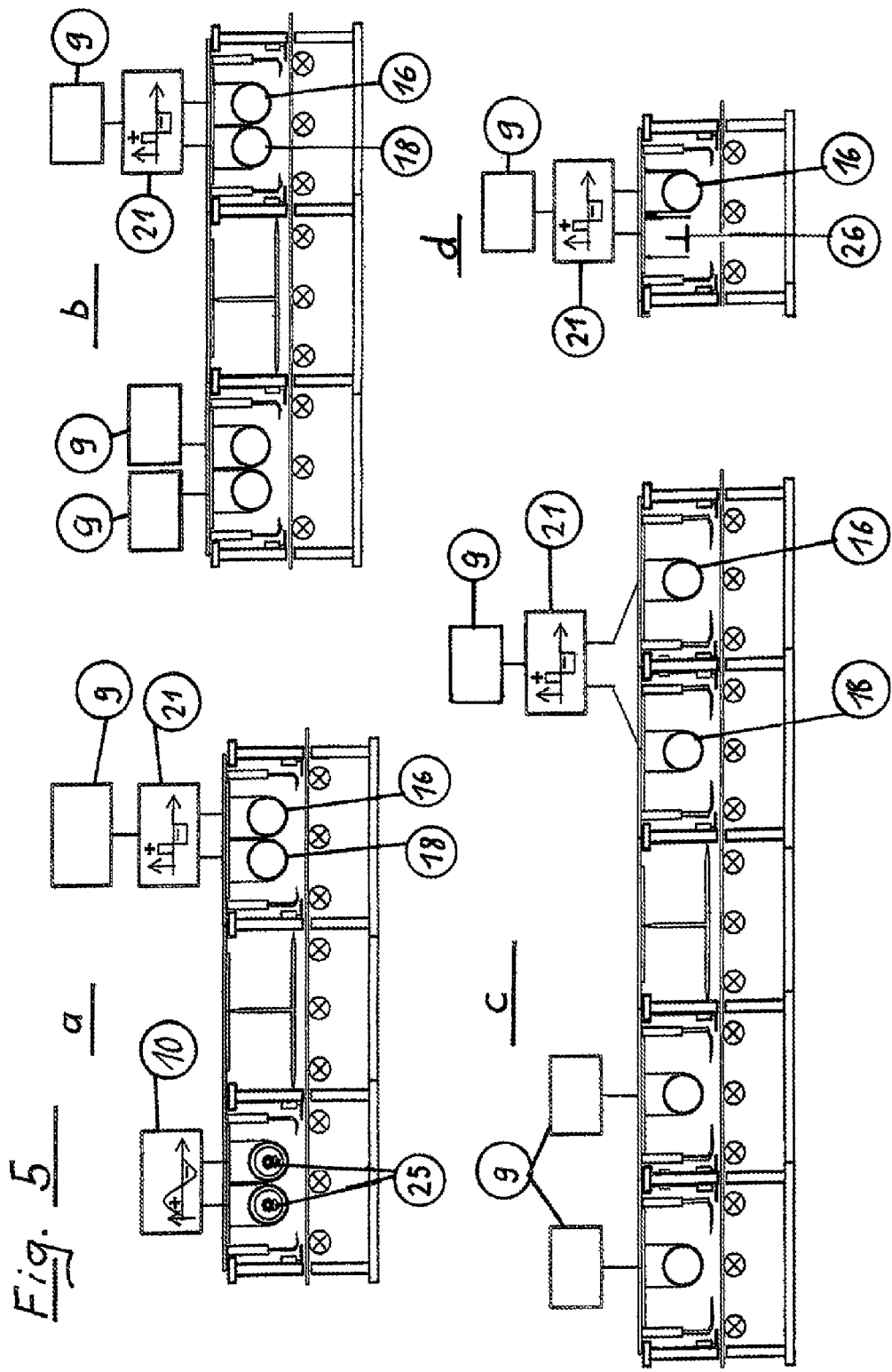

FIG. 3: shows the illustration of a coating station according to the invention FIG. 4: shows the typical signal curve of a pulse generator used according to the invention FIG. 5: shows several examples about possible replacements of conventional installations FIG. 1 shows the schematic structure of a layer stack of a low-energy coating of a substrate, for example, a glass surface as a single silver layer (single low-E) for improved thermal insulation in windows. These coatings are typically applied not only to glass substrates but rather also to films. In addition to the typical layer stacks which only contain one reflective single layer (silver layer, usually made of Ag), there are also high-quality multilayer systems which contain two, three, or more reflective single layers (silver layers, Ag) (so-called double low-E or triple low-E). These coatings, and the coatings thereof which can be tempered, have become equipped in the meantime with graduated asymmetrical metal protective layers (so-called blockers).

In these layer stacks, the number of the dielectric layers then increases in accordance with the number of the protective layers. A dielectric base layer 5 follows the actual substrate, for example, a glass surface 6 to be coated. This base layer 5 can be composed of multiple dielectric materials. A lower blocker layer 4 is applied to this base layer. A metallic functional layer 3, for example, made of silver, gold, or copper, is applied to this blocker layer 4, on which an upper blocker layer 2 follows. A dielectric outer layer 1 usually forms the terminus. This outer layer 1 can be composed of multiple dielectric materials. A final protective layer (topcoat) can optionally be applied to the dielectric outer layer 1.

To achieve and/or ensure the desired properties of the metallic functional layer 3, the blocker layers 2 and 4 have to be substantially metallic and have little reactivity in contact with the functional layer 3. This is achieved by the addition of oxygen and/or nitrogen.

In general, silver is used in this case as the metal. The individual coating stations are constructed symmetrically. The layer stack always contains a metal layer which has to be protected from the immediately following reactive deposition processes and for the subsequent tempering process. The blocker layers 2 and additionally enhance the mechanical and chemical stability (adhesion and corrosion) of the layer stack. Graded protective layers have also proven to be advantageous for this purpose. This means the structure (stoichiometry) of the respective protective layer changes more or less with the thickness of the protective layer.

FIG. 2 shows an illustration of the construction of a conventional coating station in compartment construction.

A vessel 17, which is provided with a vessel cover 11 and in which the respective substrate 12 is conveyed on transportation rollers 13, is used as the basis here.

In the first and the last chambers, the substrate 12 slides in a reduced space covered by a tunnel cover 7. In the middle chamber, a left cathode 18 and a right cathode 16 are each attached to a bearing block 8, embodied here as a tubular cathode, on the vessel cover (cathode cover) 11. Furthermore, the left gas inlet channel 19 and the right gas inlet channel 15, and also the left spraying screen 20 (sputtering screen) and the right spraying screen 14 (sputtering screen) are visible as the sputtering process region shield (mask) in this chamber. The two cathodes (dual cathode) are supplied with energy by a direct current source 9. In this case, a typical MF generator 10 supplies a sinusoidal alternating current having a frequency in the range of 10 kHz to approximately 100 kHz.

FIG. 3 shows the illustration of the construction of the coating station for the sputtering procedure according to the present invention.

The installation according to FIG. 3 corresponds in the solely mechanical equipment to the installation as was described in FIG. 2. Therefore, only the left gas inlet channel 19, the right gas inlet channel 15, and the left cathode 18 and the right cathode 16 (tubular cathode) were identified here.

The direct-current source 9 is also typical for many sputtering processes and is used, for example, for the deposition of the IR-reflecting functional layer (Ag) on individual cathodes.

The difference from the conventional sputtering procedure illustrated in FIG. 2 is that the direct current supplied by a direct-current source 9 is converted by a pulse generator 21 into a so-called bipolar pulse, as is described in FIG. 4.

FIG. 4 shows the typical signal curve of a bipolar pulse generator used according to the invention.

Such a pulse generator 21 is capable of generating two different pulsed voltage curves in one pulse period and sending them to one of the two cathodes in each case. In this case, the pulse width can be varied in the width independently of one another. This means that using the method according to the invention, the coating energy during one pulse period can be distributed as desired to the two cathodes 18 and 16. The energy supplied by the direct-current source 9 can therefore be distributed onto both cathodes in the range between 5% and 95%.

In FIG. 4, by way of example the left (positive) pulse is associated with the left cathode 18 and the right (negative) pulse is associated with the right cathode 16, wherein the respective pulse width substantially corresponds to the respective energy proportion of the total energy of a pulse period supplied to both cathodes.

A pulse period is identified by 23 in FIG. 4, wherein it is also apparent here that energy is not supplied to either of the two cathodes in the pulse pauses. Such a pulse pause is identified in FIG. 4 by idle 22 (time off).

The voltage 24 supplied by the direct-current source 9 can be up to 1000 V or more, and therefore the voltage level of each pulse results in the range between U=−1000 V and U=+1000 V.

Using the described device, it is not only possible to produce graded layers in nearly arbitrary graduation, but rather also to produce strongly structured layer constructions without changing the coating installation in its general construction.

While it is necessary in conventional installations for the production of graded layers that the two gas inlets 19 and 15 are operated asymmetrically, i.e., that both gas inlets are operated with different gas feeds, which impairs the quality of the coating and the controllability, the type and the thickness of the regions of the combined, merging (graded) coating are controlled according to the invention via the pulse generator.

In conventional coating installations, multiple coating stations are required for producing graded layers. Moreover, the variability of the gradient is extremely restricted and a change of settings usually requires the reconfiguration of the entire installation. The bipolar pulse control according to the invention not only makes all of this superfluous, but rather also expands the possibilities of the overall coating technology.

The application of the pulse control for a gradient layer also enables sensitive power ranges (low-energy introduction on the functional layer) to be executed with a gradient of the upper blocker layer.

The impairment of the properties of the functional layer by excessively high energy introduction can thus be avoided. This means the installation can save up to 30% process energy. The installation is also simplified in the construction and thus saves production and energy costs. The CO2 emission is reduced by the energy efficiency.

FIG. 5 shows several examples about possible uses of conventional installations.

Thus, a conventional installation for coatings having a moderate frequency is replaced by a coating installation having bipolar pulse control in FIG. 5a. The dual rotation cathode (dual magnetron) having magnet bar 25 corresponds to the conventional shape in general application. In FIG. 5b, a conventional installation which is operated by means of two direct-current sources is replaced by a coating installation having bipolar pulse control.

A conventional installation which is operated by means of two separate direct-current sources is replaced by a coating installation having a separate bipolar pulse controller in each case in FIG. 5c.

FIG. 5d shows a combination of a planar cathode 26 and a tubular cathode 16. The illustrations of FIG. 5a, FIG. 5b, and FIG. 5c can thus also be equipped with planar cathodes 26 and/or with combinations in the variant shown in FIG. 5c. Depending on the process, turbomolecular pumps can also be arranged above the cathodes to increase efficiency (not shown in greater detail here for reasons of comprehensibility).

LIST OF REFERENCE NUMERALS 1 dielectric outer layer
2 outer blocker layer
3 silver layer (gold or copper)
4 lower blocker layer
5 dielectric base layer (inner layer)
6 substrate, for example, glass
7 tunnel cover
8 cathode bearing block
9 DC source
10 MF generator (MF=moderate frequency)
11 vessel cover
12 substrate
13 transportation rollers
14 right spraying plate, sputtering region shield
15 right gas inlet
16 right cathode
17 vessel, trough
18 left cathode
19 left gas inlet
20 left spraying screen
21 pulse generator
22 idle (time off)
23 one period, two frequencies
24 voltage (1000 V)
25 magnet bar

The invention claimed is:

1. A device for producing defined properties of gradient layers in a system of multilayered coatings on a substrate in a sputtering process, comprising:
a cathode pair arranged in a common processing chamber, consisting of a first cathode body and a second cathode body, which is supplied with direct current by means of a common power supply, wherein the direct current is converted before entry into the processing chamber into a pulse sequence having alternating positive and negative pulses with interposed pulse pauses,
an arrangement for independently controlling a length of the individual pulses and a duration of the respective pulse pauses;
an arrangement for adjusting the first and second cathode bodies in such a manner that a common deposition region results on the substrate, and
a common process gas system, which supplies a basic supply of the process gas, wherein a separate symmetrically arranged segmented process gas system is associated with each of the first and second cathode bodies,
wherein the device comprises a machine-readable carrier having the program code of a computer program that, when executed, causes the common power supply to supply a positive pulse to the first cathode body and a negative pulse to the second cathode body, the positive pulse and the negative pulse being supplied in one pulse period to the respective first cathode and second cathode.

2. The device as claimed in claim 1, wherein the first cathode body is equipped with a different target material than the second cathode body.

3. The device as claimed in claim 1, wherein if cathode bodies in the form of tubes are used, the orientation of the magnetic fields of the individual tubular cathodes can be controlled.

4. The device as claimed in claim 1, wherein at least one or multiple turbomolecular pumps are arranged in each case above the cathode pair.

5. The device as claimed in claim 1, wherein each of the first and second cathode bodies is a planar cathode or a tubular cathode.

6. A method for producing defined properties of gradient layers in a system of multilayer coatings in a sputtering process, comprising:

replacing a direct-current or mean frequency generator in the sputtering installation with a bipolar pulse generator, connecting an output supplying a positive pulse from a bipolar pulse generator to a first cathode corresponding to a first coating task, connecting an output supplying a negative pulse from the bipolar pulse generator to a second cathode corresponding to a second coating task, generating the positive and negative pulses in the bipolar pulse generator, and supplying the positive pulse to the first cathode and the negative pulse to the second cathode, the positive pulse and the negative pulse being supplied in one pulse period to the respective first cathode and second cathode, wherein a duration of the respective pulses is carried out in accordance with the first and second coating tasks to produce a gradient layer of the multilayer coating on a substrate, wherein the duration of the positive and negative pulses are independently varied, and wherein each of the positive and negative pulses includes one or more breaks between individual durations of the pulses that interrupt the sputtering process.

7. A computer program having program code for carrying out the method steps as claimed in claim 6 when the program is executed in a computer.

8. A machine-readable carrier having the program code of a computer program for carrying out the method as claimed in claim 6 when the program is executed in a computer.

9. The device as claimed in claim 1, wherein the common power supply is further configured to supply the positive pulse and the negative pulse at a voltage ranging between 5% and 95% of the voltage supplied by the common power supply.

10. The method as claimed in claim 6, wherein the breaks for each of the positive and negative pulses are simultaneous and create an idle period between the individual durations of the positive and negative pulses.

11. The method as claimed in claim 6, wherein the multilayer coating on the substrate comprises a dielectric outer layer, an outer blocker layer, a silver layer, a lower blocker layer, and a dielectric base layer.

12. The method as claimed in claim 11, wherein each gradient layer in the multilayer coating is produced in a single sputtering process.

13. The method as claimed in claim 6, wherein the substrate is glass.

14. The method as claimed in claim 6, wherein the first or second coating tasks comprise applying a dielectric outer layer, an outer blocker layer, a silver layer, a lower blocker layer, or a dielectric base layer to the substrate.

* * * * *